(12) United States Patent
Hessling

(10) Patent No.: US 8,118,441 B2
(45) Date of Patent: Feb. 21, 2012

(54) COLOR-VARIABLE LED LIGHT, PARTICULARLY FOR LIGHTING THE INTERIOR OF VEHICLES

(75) Inventor: Andre Hessling, Vallendar (DE)

(73) Assignee: Goodrich Lighting Systems GmbH, Lippstadt (DE)

( * ) Notice: Subject to any disclaimer, the term of this patent is extended or adjusted under 35 U.S.C. 154(b) by 234 days.

(21) Appl. No.: 12/593,865

(22) PCT Filed: Apr. 15, 2008

(86) PCT No.: PCT/EP2008/054550
§ 371 (c)(1),
(2), (4) Date: Nov. 6, 2009

(87) PCT Pub. No.: WO2008/125672
PCT Pub. Date: Oct. 23, 2008

(65) Prior Publication Data
US 2010/0102736 A1    Apr. 29, 2010

Related U.S. Application Data

(60) Provisional application No. 60/912,184, filed on Apr. 17, 2007.

(30) Foreign Application Priority Data

Apr. 16, 2007 (EP) .................................... 07106236

(51) Int. Cl.
*F21V 9/16* (2006.01)
(52) U.S. Cl. ............. 362/84; 362/471; 362/488; 257/99
(58) Field of Classification Search ............... 362/84, 362/471, 488, 249.01, 249.02; 257/88, 99, 257/103; 307/10.2, 10.8
See application file for complete search history.

(56) References Cited

U.S. PATENT DOCUMENTS 6,540,377 B1 * 4/2003 Ota et al. ...................... 362/231
(Continued)

FOREIGN PATENT DOCUMENTS

DE   10 2004015570 A1   11/2005
(Continued)

*Primary Examiner* — Thuy Vinh Tran
(74) *Attorney, Agent, or Firm* — Jerry J. Holden; John D. Titus

(57) ABSTRACT

The invention relates to an LED light, particularly a reading or seat lamp for vehicles such as travel coaches or airplanes, said light being equipped with a housing (36), a plurality of LEDs comprising first LEDs (16) that transmit electromagnetic radiation in a first wavelength range, and an activation unit (12) for activating the first LEDs (16). The LED light further comprises a conversion material (24) that, upon excitation by at least part of the electromagnetic radiation from the first LEDs (1.6), emits electromagnetic radiation in a conversion wavelength range that is in the visible spectrum range and is at least partially different from the first wavelength range. The LEDs further comprise second LEDs (18) that, in order to shift the color of the electromagnetic radiation emitted by the conversion material (24) upon excitation by the electromagnetic radiation emitted by the first LEDs (16), emit electromagnetic radiation in a second wavelength range. The second LEDs (18) may be selectively activated by the activation unit (12) in addition to the first LEDs (16), wherein the electromagnetic radiation from the second LEDs (18) is at least partially in the visible spectrum range and is at least partially different from the wavelength range of the first LEDs (16) and passes the conversion material (24) substantially without exciting said conversion material and/or wherein the electromagnetic radiation of the second LEDs (18) additionally excites the conversion material (24) to emit electromagnetic radiation, the wavelength range of which is inside or outside of the conversion wavelength range.

12 Claims, 3 Drawing Sheets

U.S. PATENT DOCUMENTS

| | | | |
|---|---|---|---|
| 6,759,804 B2 * | 7/2004 | Ellens et al. | 313/512 |
| 7,023,019 B2 * | 4/2006 | Maeda et al. | 257/89 |
| 7,239,082 B2 * | 7/2007 | Bokor et al. | 313/503 |
| 2002/0079505 A1 | 6/2002 | Becker et al. | |
| 2006/0007679 A1 | 1/2006 | Allen | |
| 2006/0072314 A1 | 4/2006 | Rains | |
| 2007/0165402 A1 * | 7/2007 | Weaver et al. | 362/235 |

FOREIGN PATENT DOCUMENTS

| | | |
|---|---|---|
| EP | 1217664 A2 | 6/2002 |
| EP | 1462711 A1 | 9/2004 |
| WO | 2006047306 A1 | 5/2006 |
| WO | 2006098561 A1 | 9/2006 |

* cited by examiner

COLOR-VARIABLE LED LIGHT, PARTICULARLY FOR LIGHTING THE INTERIOR OF VEHICLES

CROSS-REFERENCE TO RELATED APPLICATIONS

This application claims priority to international application no. PCT/EP2008/054550 filed Apr. 15, 2008 which claims priority of European patent application EP 07106236.8, filed Apr. 16, 2007 and to U.S. provisional application No. 60/912,184, filed Apr. 17, 2007.

The invention relates to an LED light, particularly for use as a reading or seat light in vehicles such as e.g. overland busses or airplanes.

Due to their relatively high life expectancy and their relatively low power consumption, LED illuminants are becoming increasingly favored for installation in vehicles, while they are preferred over light bulbs as illuminants (see e.g. EP-A-1 217 664). For generating white light with a natural color impression, wide-band spectral light emission is required.

Thus, in known LED lights, use is made, apart from the LEDs, of conversion materials (e.g. on phosphor basis). The LEDs emit light of relatively high energy (e.g. blue light), wherein this high-energy light will excite the con-version material which in turn will emit light of lower energy (e.g. yellow light or yellow-red light). A certain fraction of the light with the higher energy (e.g. blue light) will pass the conversion material without exciting the same.

Depending on the field of application of an LED light, it may be desirable to shift the color of the emitted light. In LED lights for airplanes, for instance, it may be desirable to be able to switch between a cool white light and a warm white light. This is not possible when using LED lights of the known type, which comprise a plurality of identical LEDs arranged at small distances on a common substrate or formed on a common substance.

From US-A-2006/0072314, DE 10 2004 015 570, WO-A-2006/098561 and EP-A-1 462 711, it is known to mix the light of LEDs radiating with different wavelength ranges and then to emit this light. The corresponding lights comprise cavities in which the light of from the different LEDs is mixed (mixing chamber). As a consequence, the known LED lights have a relatively large constructional size so that the use of the LEDs is restricted.

Thus, it is an object of the invention to provide a LED light, particularly for use as a reading or seat light in vehicles such as e.g. overland busses or airplanes, wherein, in spite of a small constructional size of the light, the color of the emitted light can be selectively shifted.

To achieve the above object, the invention provides an LED light, particularly for use as a reading or seat light in vehicles such as e.g. overland busses or airplanes, said LED light comprising:
  a housing,
  a plurality of LEDs comprising first LEDs emitting electromagnetic radiation in a first wavelength range,
  a drive unit for activating said first LEDs, and
  a conversion material which, when excited by at least a fraction of the electromagnetic radiation of the first LEDs, emits electromagnetic radiation in a conversion wavelength range which is in the visible range of the spectrum and is at least partially different from the first wave-length range.

In this LED light, it is provided according to the invention:
  that the LEDs further comprise at least second LEDs which, for effecting a color shifting of the electromagnetic radiation emitted by the conversion material upon its excitation by the electromagnetic radiation emitted by the first LEDs, emit electromagnetic radiation in a second wavelength range,
  that the first and second LEDs, provided as semiconductor components on and/or in a common substrate having arranged above it a layer of the conversion material with an exit side facing away from the substrate, are arranged adjacent to each other and/or are configured in such a manner that the space angle regions of the radiation emitted by the individual LEDs overlap or at least contact each other before the exit side of said layer of the conversion material,
  that, by means of the drive unit, the second LEDs can optionally be driven in addition to the first LEDs,
  the electromagnetic radiation of the second LEDs being at least partially in the visible range of the spectrum and at least partially different from the wavelength range of the first LEDs and passing the conversion material substantially without exciting the same, and/or
  the electromagnetic radiation of the second LEDs additionally exciting the conversion material to cause the conversion material to emit electromagnetic radiation whose wavelength range is within or outside the conversion wavelength range.

The LED light of the invention comprises at least two groups of different LEDs. The first LEDs are operative to excite, by their radiation, the conversion material so that the latter will emit electromagnetic radiation in a con-version wavelength range which is in the visible range of the spectrum and is at least partially different from the wavelength range emitted by the first LEDs. The wavelength range of the first LEDs can be e.g. blue light. A fraction of the electromagnetic radiation emitted by the first LEDs will pass the conversion material substantially without exciting the same.

According to a first alternative of the invention, the second type of LEDs, i.e. the second LEDs, can emit electromagnetic radiation which is at least partially in the visible range of the spectrum and is at least partially different from the wavelength range of the radiation the first LEDs. According to this first variant of the invention, the energy of the radiation of the second LEDs is lower than the energy of the radiation of the first LEDs. Thus, the conversion material will be substantially not excited by the radiation of the second LEDs; instead, the electromagnetic radiation of the second LEDs will pass the conversion material to finally exit through the same.

Thus, by means of these second LEDs, it is now possible to bring about a shift of color of the light exiting from the first LEDs in combination with the conversion material.

According to a second variant of the invention, the second LEDs are operative to emit electromagnetic radiation with comparatively high energy (e.g. blue light or also UV radiation) which will additionally excite the conversion material to cause the same to emit electromagnetic radiation of lower energy. This radiation will be within or outside the conversion wavelength range—normally, however, within the conversion wavelength range—and will have the effect that the LED light will on the whole emit a total radiation having a larger intensity fraction within the conversion wavelength range. Also in this manner, a shift of color can be realized.

By the LED light of the invention, it is thus possible to shift cool white light resulting from the overlapping electromagnetic radiation of the conversion wavelength range and of the first wavelength range, toward warm white light when the second LEDs are additionally driven. Also the converse case, i.e. that the overlapping electromagnetic radiation of the conversion wavelength range and of the first wavelength range will emit light of a cool white color, which by additional activation of the second LEDs will be shifted to-ward warm white light, can be realized by the LED light of the invention.

Thus, the invention is based on the two different physical principles outlined above, which is to say, either, by use the electromagnetic radiation of the second LEDs, to drive the conversion material so that the latter will emit light of a higher intensity in the conversion wavelength range, or to use second LEDs whose light has such a low energy that it will pass the conversion material without exciting it. Both of these physical principles can also be used in combination with each other wherein, advantageously, third LEDs are used, the electromagnetic radiation of the second LEDs being different from that of said third LEDs in that, for instance, the electromagnetic radiation of the second LEDs has sufficient energy for exciting the conversion material whereas the electromagnetic radiation of the third LEDs has energy too low for exciting the conversion material.

In case that the second or third LEDs emit UV radiation, it is suitable, de-pending on the intensity of the fraction of the UV light passing the conversion material substantially without exciting the same, to use a UV filter.

To obtain a good blending of colors in spite of spatially separated first and second LEDs, it is provided according to the invention that all of said LEDs are combined into one common constructional unit. Commercially available are so-called LED modules in standard casings in which a plurality of LEDs are, in array form, arranged on a common substrate or formed within a common substrate. In contrast to known LED modules, it is provided according to the invention that such a module comprises LEDs (i.e. said first and second LEDs) which emit radiation in different wavelength ranges. Such constructional units are excellently suited for LED lights whose optics have imaging properties, or which have only low constructional heights. The substrate is provided with a layer of the conversion material below which the first and second LEDs are arranged. Because of the optically diffuse character of the conversion material and the fact that the spatial angle ranges of the radiation of the individual, mutually adjacent first and second LEDs will overlap and respectively contact each other within the conversion material layer, there is generally achieved, in spite of the flat overall construction of the LED module, a color blending of the different radiations emitted by the first and second LEDs which is agreeable to the human eye.

For color shifting, it is required to be able to drive the different groups of LEDs (e.g. said first and second LEDs) independently from each other. When using two different LEDs, a favorable option in this regard resides in operating these two groups of LEDs by application of an AC supply voltage. In this case, the first LEDs are arranged in groups of mutually series-connected LEDs, and also the second LEDs are arranged in at least one group of mutually series-connected LEDs. In such an arrangement, the plurality of groups of the first LEDs in turn are connected parallel to each other. If, now, said at least one group of second LEDs is connected in anti-parallel manner to the groups of first LEDs, either the first LEDs or the second LEDs will be fed with electric energy, depending on the polarization of the supply voltage. During the first half wave of an e.g. sinusoidal AC supply voltage, a current will be flowing through one group of the LEDs while, for the time of the second half wave, a current will be flowing through the other LEDs. The time length (pulse width) for which the LEDs during said half waves are fed with current, can be set by the drive electronics, which particularly is per-formed independently for each LED so that a shifting of color will be possible. Thus, by setting the pulse width during the two half waves, the color shift can be realized. If, during the two half waves, the pulse widths are changed by the same relative amount, an adjustment of the intensity of the light emitted by the LED light can be performed. By this type of driving, for instance, an existing LED lamp which is provided with two connectors for operation of the LEDs, can be retrofitted by installation of the inventive groups of first and second LEDs without the need to install additional supply lines. Thus, e.g. when exchange of LEDs in the reading or seat lights of an airplane, the wiring can remain unchanged.

BRIEF DESCRIPTION OF THE DRAWING

A preferred embodiment of the invention will be explained in greater detail hereunder with reference to the accompanying drawing. In particular, the following is illustrated in the drawing.

DETAILED DESCRIPTION

Figure 1:
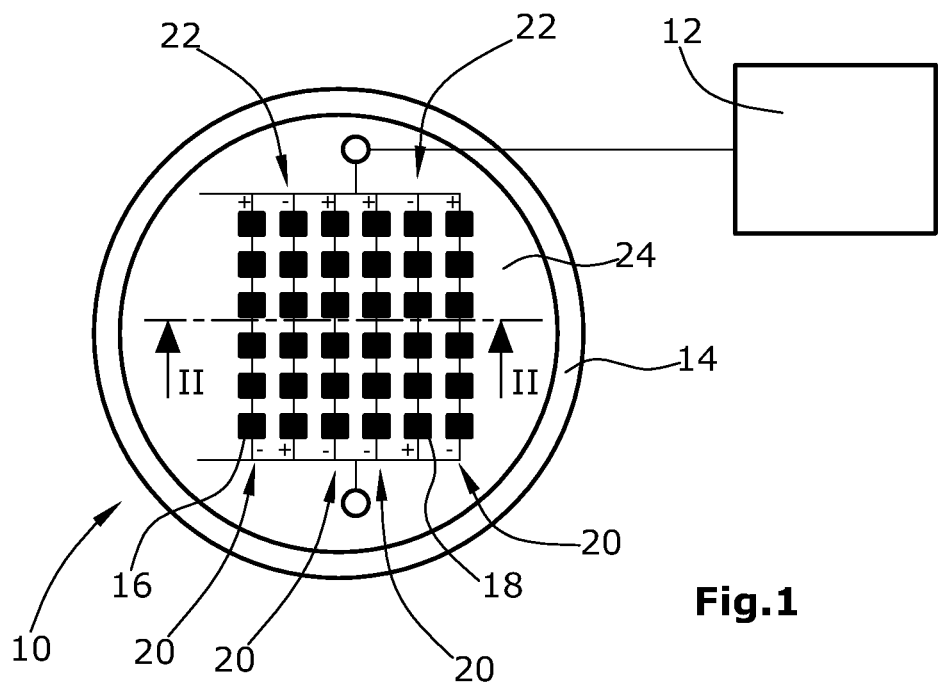
FIG. 1 is a plan view of an LED module comprising a plurality of LEDs of two different types, arranged in an array, the Figure further schematically showing a drive unit for activating the LEDs.
Figure 2:
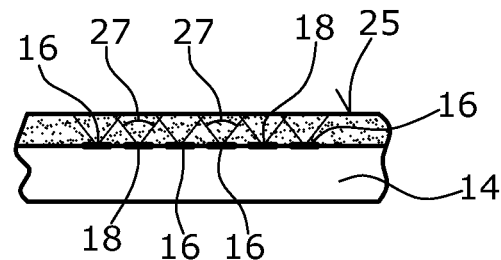
FIG. 2 is a sectional view taken along the line II-II in FIG. 1.
Figure 4:
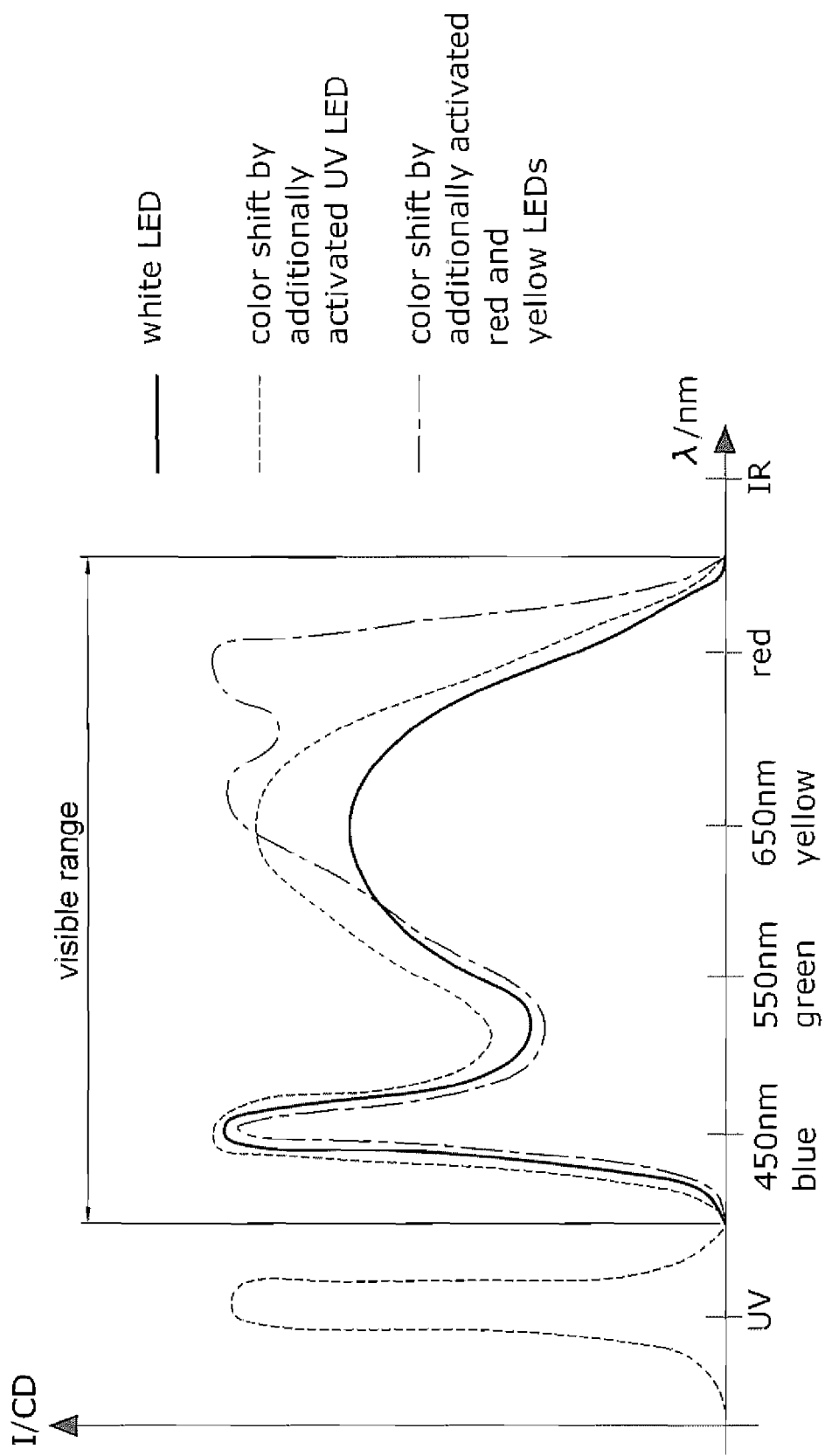
FIG. 4 is a diagram with several different curves for illustrating the intensity distribution of the emitted radiation in the visible spectrum when using different further LEDs in addition to the first group of LEDs so as to effect a color shift of the light generated by this first group of LEDs and by a conversion material excited by one of these LEDs.

FIGS. 1 and 2 are schematic plan and respectively sectional views of the configuration of an LED module 10 with electronic drive means 12, said module being of the type suitable for use in a LED light as shown in FIG. 4. LED module 10 comprises a substrate 14 wherein, in array form, first LEDs 16 and second LEDs 18 are provided as pn-type semiconductor junctions. Said first LEDs 16 are arranged in groups 20 each comprising a plurality of series-connected first LEDs 16. Also said second LEDs 18 are arranged in groups 22 each comprising a plurality of series-connected second LEDs 18. All of said groups 20,22 in turn are connected parallel to each other, said groups 22 of second LEDs 18 being connected antiparallel to said groups 20 of first LEDs 16.

The array of first and second LEDs 16,18 is covered by a layer of a (radiation) conversion material 24 of the type with optically diffuse effect, said conversion material 24 having a (light) exit side 25. The thickness of said layer and the spatial angle regions 27 within which the first and second LEDs 16,18 emit their radiation are selected such that said spatial angle regions 27 overlap each other within the layer of conversion material 24. This geometric arrangement and the conversion material 24 with its optically diffuse effect will in combination have the consequence that, as perceived by the human eye, the radiation emitted by the LEDs 16,18 is exiting as mixed light from said exit side 25 of the conversion material layer.

Figure 3:
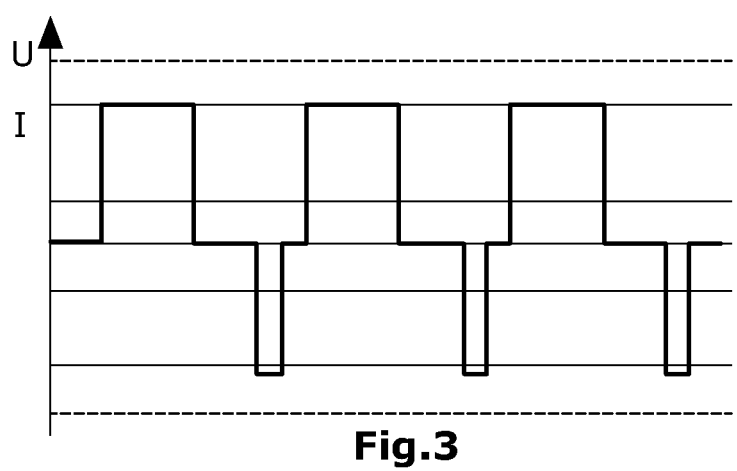
FIG. 3 is a diagram representing the development of an AC drive signal for the LED module.

The drive device 12 will impress into the array of LEDs 16,18 an electric current which is an AC current being pulse-width modulated per half wave, as can be seen in FIG. 3. In the present embodiment, if the supply voltage or supply current has a positive sign, the current will flow through the first LEDs 16 because only these first LEDs 16 are operated in the conducting direction whereas the second LEDs 18 are operated in the reverse direction. On the other hand, if the supply voltage or current has a negative sign, the second LEDs 18 will be powered whereas the first LEDs 16 are powerless and respectively are operated in the reverse direction. By the width of the positive and negative voltage or current pulses, the intensity of the color shift can be influenced, which will be explained hereunder.

In FIG. 4, the solid lines represent the spectrum of the light of LED module 10 in the situation where only the first LEDs 16 are operated. In this embodiment, it be assumed that the first LEDs 16 emit blue light (wavelength: 450 nm). All LEDs 16,18 of LED module 10 are arranged behind the layer of diffuse conversion material 24 being based e.g. on phosphor (see FIG. 2). This conversion material 24 is effective to convert excitation radiation of high energy into electromagnetic radiation of low energy which will then be emitted by the conversion material 24. Thus, the spectrum of the light radiated by the first LEDs 16 and the conversion material 24 will take the development represented by the solid line in FIG. 4. A fraction of the radiation of the first LEDs 16 will pass the conversion material 24 without exciting the same, so that the emitted light will have a blue fraction. The remaining fraction of the blue light (excitation radiation) of the first LEDs 16 will be converted by the conversion material 24 into light of lower energy, i.e. light of a higher wavelength, namely yellow and/ or yellow-red light. This is represented by the solid curve in FIG. 4.

The thus resulting light distribution corresponds e.g. to cool white light. If it is now intended to shift the color of this light towards warm white, the second LEDs 18 are to be driven which in turn will emit either electromagnetic radiation with sufficient energy for exciting the conversion material 24, or, however, radiation whose energy is too weak to excite the conversion material 24 or is lower than the radiation emitted by the conversion material 24.

The first and second LEDs 16,18 are actuated with high frequency, in an alternating manner and independently from each other. The drive frequency is selected to the effect that the human eye, due to its inertia, cannot perceive the driving of the first and second LEDs 16,18.

According to a first variant of the embodiment described herein, it be assumed that the second LEDs 18 emit UV light. This UV light will partially pass through the conversion material 24 without exciting the same. The other fraction of the UV light, however, will excite the conversion material 24 to cause it to emit radiation, so that the intensity of the light influenced by the conversion material 24 will increase within the emission spectrum. This circumstance is represented in FIG. 4 by the interrupted line. By the increase of the light intensity of the light of the longer wavelength, there is on the whole generated a warm white light, thus realizing the desired color shift.

According to a further variant of the LED light described herein, the second LEDs 18 are operative to emit light whose wavelength range is within the visible range and outside the conversion wavelength range. For example, the second LEDs 18 emit red light. The energy of this light is too low for exciting the conversion material 24. As a consequence, there is generated an addition of radiation fractions in the visible wavelength range, as represented in FIG. 4 by the chain-dotted line.

At this point, it is to be stated that the concept of the invention is not restricted to the use of merely two different types of LEDs for achieving a de-sired shift of color. For instance, it is possible to use, apart from the first LEDs, two further types of LEDs, i.e. second and third LEDs of which one type will emit radiation with sufficient energy for exciting the conversion material 24, whereas the others will emit electromagnetic radiation in the visible range and with an energy insufficient for exciting the conversion material 24. Also further combinations of LEDs emitting different electromagnetic radiations are possible in addition to the first LEDs. Thus, for instance, one could use LEDs which radiate partially in the visible wavelength range but also emit wavelength components with sufficient energy for ex-citing the conversion material 24.

Figure 5:
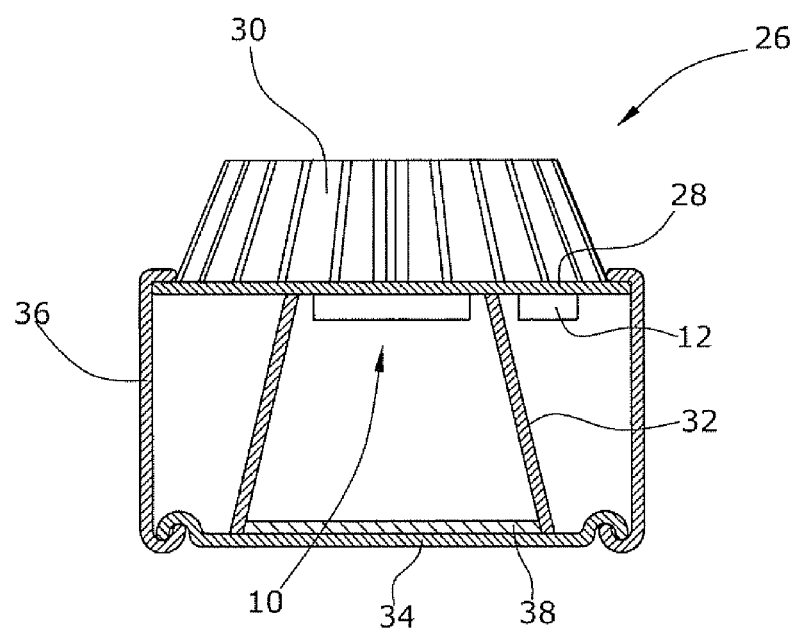
FIG. 5 is a schematic representation of the design of an LED reading light using the LED module shown in FIG. 1.

FIG. 5 is a schematic view of an LED reading light 26 equipped with the LED module 10 according to FIG. 1, with use being made of an activation of the two LED groups as described in FIGS. 1 to 3. The overall radiation emitted by the different LEDs in combination with the conversion material can comprise one of the spectrum developments represented in FIG. 4.

The LED reading light 26 according to FIG. 5 comprises the LED module 10 which is arranged on a circuit board 28 which also carries the electronics for the drive unit 12. LED module 10 is cooled by a cooling body 30. The LED reading light 26 further comprises a reflector 32 and a light disk 34 which are accommodated in a casing schematically outlined at 36. Said light disk 34 can comprise a UV filter coating 38.

At this point, it is to be emphasized that the anti-parallel connection, described in the context of FIG. 1, of the two groups of first LEDs relative to the groups of second LEDs is not absolutely required for the invention. However, this type of anti-parallel connection of two groups of LEDs has the advantage that, for activating the two LED types in an alternating manner and independently from each other, as in an LED module comprising only one type of LEDs, one drive conduit will be required. Thus, the wiring concept of the first and second LEDs 16,18 according to FIG. 1 represents an interested solution in a situation where LED illuminants comprising only one type of LEDs have to be retrofitted with, or exchanged for, LED illuminants comprising two types of LEDs. In such lighting systems, the hardware (wiring) can then remain unchanged; it will merely required to newly program the driving process for the individual LED illuminants, which, however, is a matter of limited complexity. It can also be provided that at least one further group of (third) LEDs is connected anti-parallel to the groups of first LEDs. In this variant, the first LEDs would be driven during one half wave of the AC driving signal, and the second and third LEDs would be driven during the other half wave.

However, it can also be provided to drive only one group of (first) LEDs by a positive voltage, and only the other group of (second and third) LEDs by a negative voltage.

Thus, in case that the marginal condition that only one drive conduit exists for activating two different types of LEDs, is not fulfilled, the LED module can also be driven via a multi-channel drive unit. In such a case, the LED module can also comprise more than two different LED types.

What is claimed is:
1. An LED light, particularly for use as a reading or seat light in vehicles, said LED light comprising:
a housing (36),
a plurality of LEDs comprising first LEDs (16) emitting electromagnetic radiation in a first wavelength range,
a drive unit (12) for activating said first LEDs (16), and a conversion material (24) which, when excited by at least a fraction of the electromagnetic radiation of the first LEDs (16), emits electromagnetic radiation in a conversion wavelength range which is in a visible range of a spectrum and is at least partially different from the first wavelength range, wherein the plurality of LEDs further comprise at least second LEDs (18) which, for effecting a color shifting of the electromagnetic radiation emitted by the conversion material (24) upon its excitation by the electromagnetic radiation emitted by the first LEDs (16), emit electromagnetic radiation in a second wavelength range, the first and second LEDs (16,18), provided as semiconductor components with a common substrate (14) having arranged above it a layer of the conversion material (24) with an exit side (25) facing away from the common substrate (14), are configured in a manner that space angle regions (27) of radiation emitted by individual LEDs at least contact each other before the exit side (25) of said layer of the conversion material (24), that, by means of the drive unit (12), the second LEDs (18) are driven in addition to the first LEDs (16), the electromagnetic radiation of the second LEDs (18) being at least partially in the visible range of the spectrum and at least partially different from the wavelength range of the first LEDs (16) and passing the conversion material (24) substantially without exciting the same, and the electromagnetic radiation of the second LEDs (18) additionally exciting the conversion material (24) to cause the conversion material (24) to emit electromagnetic radiation whose wavelength range is within or outside the conversion wavelength range.

2. The LED light according to claim 1, wherein (i) the overlapped electromagnetic radiation from the conversion wavelength range and the first wavelength range is effective to generate light of a cool white color and, by additionally activating the second LEDs (18), said cool white color can be shifted toward warm white light, or (ii) the overlapped electromagnetic radiation from the conversion wavelength range and the first wavelength range is effective to generate light of a warm white color and, by additionally activating the second LEDs (18), said color is shifted toward cool white light.

3. The LED light according to claim 1, wherein the first LEDs (16) emit blue light, at least a fraction of said blue light passing the conversion material (24) without exciting the same, wherein the conversion material (24) is excited by the remaining fraction of said blue light to emit light of lower energy, which is yellow and/or green light, and wherein the second LEDs (18) emit UV light, a fraction of said UV light exciting the conversion material (24) to cause the conversion material (24) to additionally emit electromagnetic radiation within or outside the conversion wavelength range, and/or light of lower energy, at least a fraction of said light of lower energy passing the conversion material (24) substantially without exciting the same.

4. The LED light according to claim 3, further comprising a UV filter for filtering the UV light of the second LEDs (18) that passes the conversion material (24) without exciting the same.

5. The LED light according to claim 1, wherein the first LEDs (16) are arranged in groups of LEDs connected in series relative to each other, the groups of the first LEDs (16) in turn being connected parallel to each other, and that the second LEDs (18) are arranged in at least one group of LEDs connected in series relative to each other.

6. The LED light according to claim 5, wherein said at least one group of second LEDs (18) are connected parallel to said groups of first LEDs (16) and with reversed polarity relative to the latter, and wherein the first and second LEDs (16,18) are driven through application of a voltage to said parallel arrangement of groups of first and second LEDs (16,18) by means of the drive unit (12) by application of a DC voltage with a first polarity, to selectively drive only the first LEDs (16), by application of a DC voltage with a second polarity opposite to said first polarity, to selectively drive only the second LEDs (18), and by application of an AC voltage, to selectively drive the first and second LEDs (16,18) alternately.

7. The LED light according to claim 1, wherein the first and second LEDs (16,18) are arranged on the common substrate (14) and are combined to form a common constructional unit.

8. The LED light according to claim 1, wherein the at least second LEDs (18) comprise second and third LEDs, the electromagnetic radiation of the second LEDs being at least partially in the visible range of the spectrum, further being at least partially different from the wavelength range of the first LEDs (16) and passing the conversion material (24) substantially without exciting the same, and that the electromagnetic radiation of said third LEDs additionally excites the conversion material (24) to cause the conversion material (24) to emit electromagnetic radiation whose wavelength range is within or outside the conversion wavelength range.

9. An LED light comprising:

a housing having a light exit aperture;

a first plurality of LEDs contained within said housing, said first plurality of LEDs being capable of emitting electromagnetic radiation in a first wavelength range;

a conversion material which, when excited by electromagnetic radiation in the first wavelength range, emits electromagnetic radiation in a conversion wavelength range which is in a visible range of the spectrum and is at least partially different from the first wavelength range, said conversion material covering said light exit aperture;

a second plurality of LEDs contained within said housing, said second plurality of LEDs being capable of emitting electromagnetic radiation in a second wavelength range at least partially in a visible spectrum and at least partially different from the first wavelength range;

said first and second plurality of LEDs configured so that a space angle region of radiation emitted by at least one of said first plurality of LEDs overlaps a space angle region of radiation emitted by at least one of said second plurality of LEDs when passing through said conversion material; and a drive device for selectively driving said first plurality of LEDs at a first duty cycle and said second plurality of LEDs at a second duty cycle.

10. The LED light of claim 9, wherein:

said first plurality of LEDs are connected between a common source line and a common drain line with a common forward bias direction defining a first polarity; and said second plurality of LEDs are connected between said common source and said common drain with a common forward bias direction having a polarity opposite said first polarity; whereby positive voltage on the common source line will cause current to flow through one of said first and second plurality of LEDs and negative voltage on the common source line causes current to flow through the other of said first and second plurality of LEDs.

11. The LED light of claim 10, wherein:
said drive device provides an alternating current signal across said common source line and said common drain line.

12. The LED light of claim 11, wherein:
said drive device provides a first duty cycle when said alternating current signal is positive and a second duty cycle when said alternating current signal is negative, whereby a duty cycle of said first plurality of LEDs is variable independent of a duty cycle of said second plurality of LEDs.

* * * * *